(12) United States Patent
Kim et al.

(10) Patent No.: US 11,189,471 B2
(45) Date of Patent: Nov. 30, 2021

(54) HIGH FREQUENCY GENERATOR HAVING DUAL OUTPUTS AND ITS DRIVING METHOD

(71) Applicant: Newpowerplasma Co., Ltd., Pyoungtak-si (KR)

(72) Inventors: Jongwoon Kim, Hwaseong-si (KR); Inbum Kim, Suwon-si (KR); Seunghee Ryu, Anyang-si (KR)

(73) Assignee: NEWPOWERPLASMA CO., LTD., Pyoungtak-si (KR)

( * ) Notice: Subject to any disclaimer, the term of this patent is extended or adjusted under 35 U.S.C. 154(b) by 2 days.

(21) Appl. No.: 16/943,246

(22) Filed: Jul. 30, 2020

(65) Prior Publication Data
US 2021/0327680 A1 Oct. 21, 2021

(30) Foreign Application Priority Data

Apr. 16, 2020 (KR) .................. 10-2020-0045846
Apr. 16, 2020 (KR) .................. 10-2020-0045897

(51) Int. Cl.
*H01J 37/32* (2006.01)
*H03F 3/19* (2006.01)
*H03K 5/24* (2006.01)

(52) U.S. Cl.
CPC .... *H01J 37/3299* (2013.01); *H01J 37/32183* (2013.01); *H03F 3/19* (2013.01);
(Continued)

(58) Field of Classification Search
CPC .............. H01J 37/3299; H01J 37/32183; H01J 223/24564; H01J 237/334; H03F 3/19; H03F 2200/451; H03K 5/24
See application file for complete search history.

(56) References Cited

U.S. PATENT DOCUMENTS

| 4,871,421 A | 10/1989 | Ogle et al. |
| 8,044,594 B2 | 10/2011 | Morgan et al. |

(Continued)

FOREIGN PATENT DOCUMENTS

| KR | 1019900005855 A | 4/1990 |
| KR | 1020160011564 A | 2/2016 |
| KR | 1020170093875 A | 8/2017 |

*Primary Examiner* — Dinh T Le
(74) *Attorney, Agent, or Firm* — Rabin & Berdo, P.C.

(57) ABSTRACT

A high frequency generator having dual outputs comprises: a high frequency amplifying unit configured to amplify a DC voltage of a predetermined level, and output a first and a second high frequency amplification signal; a combiner configured to combine the first high frequency amplification signal and the second high frequency amplification signal, and output a high frequency power signal; a high frequency sensor disposed on output side of the combiner, configured to detect an electrical signal flowing the output side of the combiner, and output an electrical detection signal; a controller configured to output multiple control signals by using an externally applied control signal and the electrical detection signal; and a switching unit disposed between the combiner and the plasma chamber, and controlled by a switching control signal outputted from the controller to output the high frequency power signal to a first high frequency power output signal through a first output terminal and to output the high frequency power signal to a second high frequency power signal through a second output terminal.

13 Claims, 11 Drawing Sheets

(52) U.S. Cl.
CPC ...... *H03K 5/24* (2013.01); *H01J 2237/24564* (2013.01); *H01J 2237/334* (2013.01); *H03F 2200/451* (2013.01)

(56) References Cited

U.S. PATENT DOCUMENTS

| | | | |
|---|---|---|---|
| 8,779,322 B2* | 7/2014 | Holber | H01J 37/32174 219/121.41 |
| 9,042,121 B2* | 5/2015 | Walde | H02M 7/53871 363/16 |
| 9,767,988 B2* | 9/2017 | Brouk | H01J 37/32009 |
| 10,192,721 B2* | 1/2019 | Kasai | H03F 3/2173 |
| 10,546,724 B2* | 1/2020 | Radomski | H01J 37/32183 |
| 2016/0027619 A1 | 1/2016 | Sato et al. | |

\* cited by examiner

HIGH FREQUENCY GENERATOR HAVING DUAL OUTPUTS AND ITS DRIVING METHOD

TECHNICAL FIELD

The present disclosure relates to a high frequency generator, and more particularly, to a high frequency generator having dual outputs and its driving method.

BACKGROUND ART

Plasma etching is frequently used in a semiconductor manufacturing process. In the plasma etching, ions are accelerated by an electric field in order to etch an exposed surface on a substrate. The electric field is generated according to high frequency signals generated by a high frequency generator of a high frequency power system. The high frequency signals generated by the high frequency generator need to be precisely controlled such that the plasma etching is efficiently performed.

The high frequency power system may include the high frequency generator, an impedance matcher, and a plasma chamber such as a load. The high frequency signals are used to drive loads in order to manufacture various components such as integrated circuits (ICs), solar panels, compact disks (CDs), and DVDs. The loads may include broadband mismatched loads (for example, mismatch resistor terminals), narrowband mismatch loads (for example, 2-components matching network), and cables with resonator loads.

The high frequency signals are received in matching network. The matching network matches an input impedance of the matching network to a characteristic impedance of a transmission line between the high frequency generator and the matching network. Impedance matching helps to minimize an amount of power ("forward power") of an impedance matcher applied to the matching network toward the plasma chamber in a forward direction, and helps to minimize an amount of power ("backward power") reflected from the matching network to the high frequency generator. When the input impedance of the impedance matcher matches the characteristic impedance of the transmission line, output of the forward power from the high frequency generator to the plasma chamber may be maximized and the backward power may be minimized.

FIG. 1 is a high frequency plasma supply device generating a plasma power to supply a plasma load 7 according to a prior art.

The high frequency plasma supply device according to the prior art includes an AC-DC converting unit 1, a first high frequency generating unit 2, a second high frequency generating unit 3, a combiner 4, a high frequency sensor 5, and a controller 6.

The AC-DC converting unit 1 converts a commercial AC voltage to DC voltage of predetermined level.

The first high frequency generating unit 2 and the second high frequency generating unit 3 generates a high frequency signal using DC voltage outputted from the AC-DC conversion 1 respectively.

The combiner 4 combines the high frequency signal outputted from the first high frequency generating unit 2 and the high frequency signal outputted from the second high frequency generating unit 3.

The high frequency sensor 5 senses a forward high frequency power outputted from the combiner 4 to the plasma load 7 or a backward high frequency power outputted from the plasma load 7 to the combiner 4.

The controller 6 generates control signals to control the AC-DC converting unit 1, the first high frequency generating unit 2 and the second high frequency generating unit 3, using a detection signal outputted from the high frequency sensor 5.

Meanwhile, as shown in FIG. 1, when the high frequency plasma supply device supplies high frequency power to the plasma chamber as the load, the high frequency plasma supply device supplies high frequency power to only one electrode of the plasma chamber, and the other side of the plasma chamber is connected to the ground side. However, there is a demand for generating plasma of various sizes in the plasma chamber by the advancement of process technology. Thus, according to another prior art, the high frequency power may be separately supplied to an upper electrode and a lower electrode of the plasma chamber by using two high frequency plasma supply devices.

CITATION LIST

Patent Literature (Patent Literature 1) U.S. Pat. No. 8,044,594

DISCLOSURE

Technical Problem

Accordingly, an object of the present invention is to provide a high frequency generator having dual outputs capable of supplying high frequency power signals to both ends of the plasma chamber.

Another object of the present invention is to provide a high frequency generator having dual outputs capable of providing two high frequency power signals with one generator.

Another object of the present invention is to provide a high frequency generator having dual outputs capable of precisely controlling the plasma generated in the plasma chamber by selectively providing two high frequency power signals.

Another object of the present invention is to provide a high frequency generator capable of monitoring dual outputs that is robust to changes of the load impedance.

Technical Solution

In an embodiment, a high frequency generator having dual outputs comprises: a high frequency amplifying unit configured to amplify a DC voltage of a predetermined level, and output a first and a second high frequency amplification signal; a combiner configured to combine the first high frequency amplification signal and the second high frequency amplification signal, and output a high frequency power signal; a high frequency sensor disposed on output side of the combiner, configured to detect an electrical signal flowing the output side of the combiner, and output an electrical detection signal; a controller configured to output multiple control signals by using an externally applied control signal and the electrical detection signal; and a switching unit disposed between the combiner and the plasma chamber, and controlled by a switching control signal outputted from the controller to output the high frequency power signal to a first high frequency power output signal through a first output terminal and to output the high frequency power signal to a second high frequency power signal through a second output terminal.

In the high frequency generator having dual outputs, wherein the switching unit is implemented by a mechanical switch or an electronic switch, the first high frequency power output signal outputted through the first output terminal of the switch is outputted to an upper electrode of the plasma chamber and the second high frequency power output signal outputted through the second output terminal of the switch is outputted to a lower electrode of the plasma chamber.

In the high frequency generator having dual outputs, wherein the first and the second high frequency power signals are outputted periodically or aperiodically.

In the high frequency generator having dual outputs, the high frequency generator further includes a dual outputs monitoring unit configured to monitor an operation state of the switching unit by detecting the first and the second high frequency power output signals.

In the high frequency generator having dual outputs, wherein the dual outputs monitoring unit comprises: a first and a second high frequency power detectors configured to detect a first high frequency power from the first high frequency power output signal and detect a second high frequency power of the second high frequency power output signal respectively; a first and a second impedance matchers configured to match an impedance of the first high frequency power and an impedance of a first comparator and match an impedance of the second high frequency power and an impedance of a second comparator respectively; a backward signal blocking unit including a first one-way element and a second one-way element, wherein the first one-way element blocks signals flowing from the first comparator to the first high frequency power detector, and the second one-way element blocks signals flowing from the second comparator to the second high frequency power detector; and a noise interference cancelling unit including a third one-way element and a fourth one-way element, wherein the third one-way element is connected forwardly from an output terminal of the first one-way element to a reference voltage terminal and the fourth one-way element is connected forwardly from an output terminal of the second one-way element to the reference voltage terminal, wherein the first comparator compares an output voltage of the first one-way element with the reference voltage and the second comparator compares an output voltage of the second one-way element with the reference voltage.

In the high frequency generator having dual outputs, wherein the first high frequency power detector includes a first micro strip transformer connected to the first output terminal of the switching unit, and the second high frequency power detector includes a second micro strip transformer connected to the second output terminal of the switching unit.

In the high frequency generator having dual outputs, wherein each of the first to the fourth one-way elements is diode.

In another embodiment, a driving method for a high frequency generator having dual outputs comprises: a high frequency amplifying step to amplify a DC voltage of a predetermined level, and output a first and a second high frequency amplification signal by a high frequency amplifying unit; a high frequency amplification signal combining step to combine the first high frequency amplification signal and the second high frequency amplification signal, and output a high frequency power signal by a combiner; an electric signal detecting step to detect an electric signal flowing the output side of the combiner, and output an electric detection signal by an electric signal detecting unit; a switching control signal outputting step to output multiple control signals by using an externally applied control signal and the electric detection signal by a controller; and a switching step to output the high frequency power signal to a first high frequency power output signal through a first output terminal and to output the high frequency power signal to a second high frequency power signal through a second output terminal controlled by a switching control signal outputted from the controller.

In the driving method for a high frequency generator having dual outputs, wherein the switching unit is implemented by a mechanical switch or an electronic switch, the first high frequency power output signal outputted through the first output terminal of the switch is outputted to the upper electrode of the plasma chamber and the second high frequency power output signal outputted through the second output terminal of the switch is outputted to the lower electrode of the plasma chamber.

In the driving method for a high frequency generator having dual outputs, wherein the first and the second high frequency power signals are outputted periodically or aperiodically.

In the driving method for a high frequency generator having dual outputs, the driving method for a high frequency generator further includes a dual outputs monitoring step to monitor the operation state of the switching unit by detecting the first and the second high frequency power output signals.

In the driving method for a high frequency generator having dual outputs, wherein the dual outputs monitoring step comprises: a high frequency power detecting step to detect a first high frequency power from the first high frequency power output signal and to detect a second high frequency power of the second high frequency power output signal; an impedance matching step to match the impedance of the first high frequency power and the impedance of a first comparator, and match the impedance of the second high frequency power and the impedance of a second comparator; a backward signal blocking step to block signals flowing from the first comparator to the first high frequency power detector by a first one-way element, and to block signals flowing from the second comparator to the second high frequency power detector by a second one-way element; a noise interference cancelling step to cancel a noise flowing from a reference voltage terminal to the output terminal of the first one-way element, and to cancel a noise flowing from the reference voltage terminal to the output terminal of the second one-way element; and a comparing step to compare the output voltage of the first one-way element with the reference voltage by the first comparator and to compare the output voltage of the second one-way element with the reference voltage by the second comparator.

In the driving method for a high frequency generator having dual outputs, wherein the first high frequency power detector includes a first micro strip transformer connected to the first output terminal of the switch, and the second high frequency power detector includes a second micro strip transformer connected to the second output terminal of the switch.

In the high frequency generator having dual outputs, the switch is implemented by a mechanical switch or electronic switches, one of the multiple high frequency power output signals outputted via the mechanical switch or the electronic switches is alternately outputted to the upper electrode or the lower electrode of the plasma chamber.

Advantageous Effects

According to the high frequency generator having dual outputs of the present invention, it is possible to supply high frequency power signals to both electrodes of a plasma chamber, and to provide two high frequency power output signals with one generator. And it is possible to precisely control a plasma generated in the plasma chamber by selectively providing the two high frequency power output signals.

In addition, the high frequency generator having dual outputs of the present invention, even if the load impedance changes due to change of a forward high frequency power and a backward high frequency power, the operation state of a switching unit for selectively outputting a high frequency output signal outputted from the combiner to the both electrodes of the plasma chamber can be accurately detected.

In addition, the high frequency generator having dual outputs of the present invention can supply the high frequency power signal to both electrodes of the plasma chamber, and one high frequency generator having dual outputs can provide selectively two high frequency power signals. The plasma to generate in the plasma chamber can be precisely controlled.

In addition, by providing two high frequency power signals with one high frequency generator, the size of the high frequency generator can be greatly reduced, thereby greatly reducing the manufacturing cost.

MODE FOR INVENTION

Figure 1:
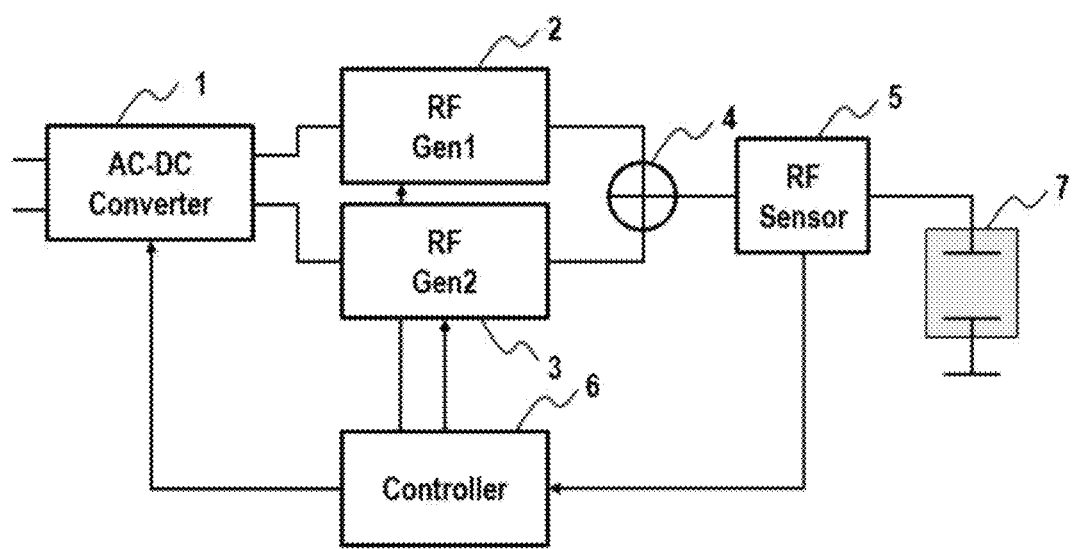
FIG. 1 is a block diagram illustrating a high frequency plasma supply device according to a prior art.

Additional objects, features, and advantages of the present disclosure will be understood more clearly from the following detailed description and the accompanying drawings.

Prior to the detailed description of the present disclosure, the present disclosure may be variously modified and may have various embodiments, and it should be understood that examples to be described below and illustrated in the drawings is not intended to limit the present disclosure to specific embodiments and include all modifications, equivalents, and substitutes included in the spirit and technical range of the present disclosure.

It will be understood that when an element is referred to as being "connected" or "coupled" to another element, it can be directly connected or coupled to the other element or intervening elements may be present therebetween. In contrast, when an element is referred to as being "directly connected" or "directly coupled" to another element, there are no intervening elements therebetween.

The terminology used herein is for the purpose of describing particular embodiments only and is not intended to limit the disclosure. As used herein, the singular forms "a", "an" and "the" include the plural forms as well, unless the context clearly indicates otherwise. It will be further understood that the terms "comprises", "comprising,", "includes" and/or "including", when used herein, specify the presence of stated features, numbers, steps, operations, elements, components, or combinations thereof, but do not preclude the presence or addition of one or more other features, numbers, steps, operations, elements, components, or combinations thereof.

Furthermore, a term such as " . . . section", " . . . unit", and " . . . module" described in this specification means a unit for processing at least one function or operation, and this may be implemented with hardware, software, or a combination of the hardware and the software.

Furthermore, in the following description with reference to the accompanying drawings, the same reference numerals are given to the same components and a redundant description thereof will be omitted. Detailed descriptions related to well-known functions or configurations will be ruled out in order not to unnecessarily obscure subject matters of the present disclosure.

Figure 2:
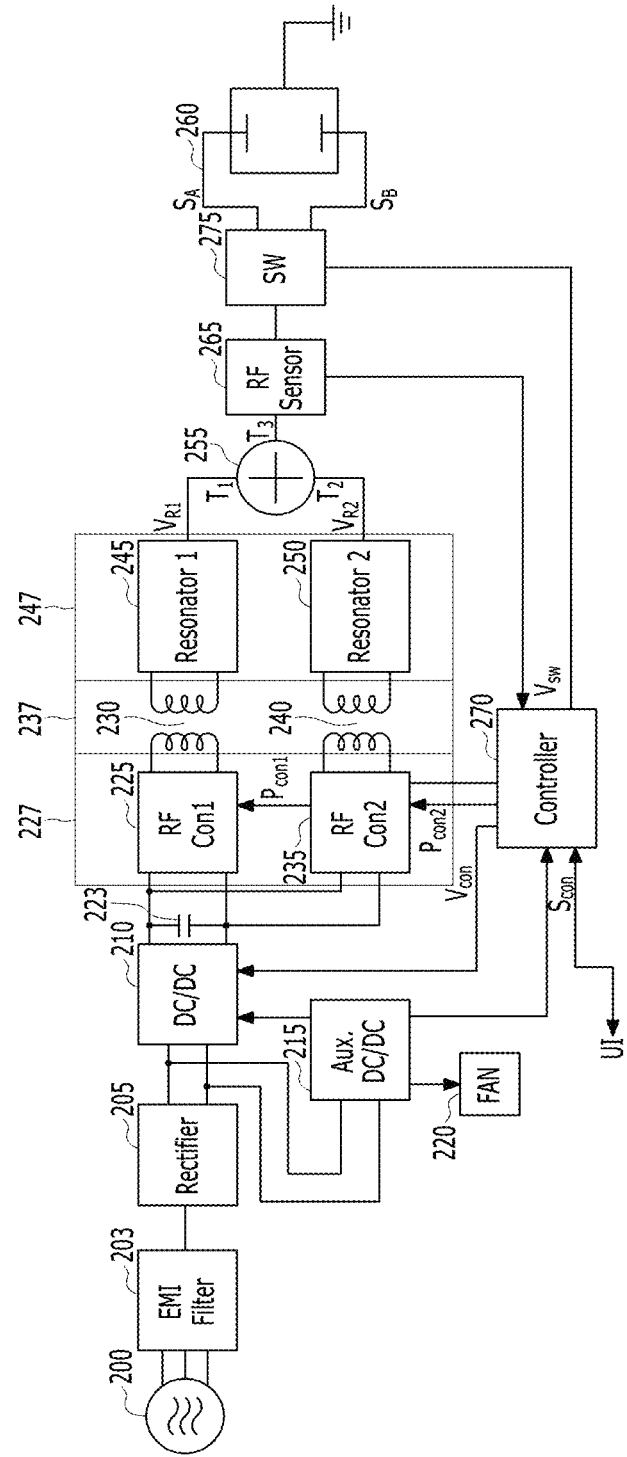
FIG. 2 is a block diagram illustrating a high frequency generator having dual outputs according to an embodiment of the present invention.

FIG. 2 is a block diagram illustrating a high frequency generator having dual outputs according to the present invention.

The high frequency generator having dual outputs according to the present invention includes an EMI filter 203, a rectifier 205, a DC/DC converter 210, an auxiliary DC/DC converter 215, a fan 220, a smoother 223, a high frequency converting unit 227, a coupling transforming unit 237, a resonating unit 247, a combiner 255, a high frequency sensor 265, a plasma chamber 260, a controller 270 and a switching unit 275.

The EMI filter 203 shields electromagnetic wave type noise contained in three-phase commercial power source.

The rectifier 205 rectifies three-phase voltage to DC voltage.

The DC/DC converter 210 is controlled by a voltage control signal Vcon outputted from the controller 270 to convert a DC voltage outputted from the rectifier 205 into a second DC voltage. The second DC voltage outputted from the DC/DC converter 210 may be a voltage having various levels.

The auxiliary DC/DC converter 215 converts the DC voltage outputted from the rectifier 205 into a DC voltage for the auxiliary power supply, and supplies the DC voltage to the fan 220, the DC/DC converter 210, and the controller 270.

The smoother 223 smooths the DC voltage outputted from the DC/DC converter 210.

The high frequency converting unit 227 amplifies a DC voltage of a predetermined level outputted from the DC-DC converter 210 to generate high frequency signals having a pulse waveform. The high frequency converting unit 227 may operate two or more high frequency converters in parallel to generate high frequency power signal having voltages and frequencies suitable for various load conditions.

In one embodiment of the present invention, the high frequency converting unit 227 includes two high frequency converters 225 and 235. The first high frequency converter 225 is controlled by a first conversion control signal Pcon1 outputted from the controller 270 and outputs a first high frequency conversion signal v1. The second high frequency converter 235 is controlled by a second conversion control signal Pcon2 outputted from the controller 270 and outputs a second high frequency conversion signal v2. A phase of the first high frequency conversion signal v1 may be the same as the one of the second high frequency conversion signal v2 or the phase of the first high frequency conversion signal v1 may be different from the one of the second high frequency conversion signal v2.

The coupling transforming unit 237 includes a first coupling transformer 230 and a second coupling transformer 240. The first coupling transformer 230 induces a high frequency power signal of a pulse waveform outputted from the first high frequency power converter 225 to a secondary side, and the second coupling transformer 240 induces a high frequency power signal of a pulse waveform outputted from the second high frequency power converter 235 to the secondary side. The coupling transforming unit 237 electrically insulates a primary side and the secondary side, so that it is to prevent an electric shock accident that may occur when a user contacts a plasma chamber included in a RF load.

The resonating unit 247 includes a first resonator 245 and a second resonator 250. The first resonator 245 and the second resonator 250 have an inductor and a capacitor coupled in parallel respectively. The resonating unit 247 outputs radio resonant frequency signals having a sine wave having a predetermined resonant frequency by using a high frequency signal induced on the secondary side of the coupling transforming unit 237. The first resonator 245 outputs a first high frequency amplification signal vR1 and the second resonator 250 outputs a second high frequency amplification signal vR2.

Meanwhile, a phase of the first high frequency amplification signal vR1 may be the same as the one of a second high frequency amplification signal vR2 or the phase of the first high frequency amplification signal vR1 may be different from the one of the second high frequency amplification signal vR2. When the phase of the first high frequency amplification signal vR1 and the phase of the second high frequency amplification signal vR2 are different from each other, the phase of the second high frequency amplification signal vR2 leads or lags the phase of the first high frequency amplification signal vR1. A resonant frequency of the high frequency amplification signals of the present invention may be 13.56 MHz.

A high frequency amplifying unit according to an embodiment of the present invention may include the high frequency converting unit 227, the coupling unit 237, and the resonating unit 247. And the high frequency amplifying unit may include a first high frequency amplifier and a second high frequency amplifier. The first high frequency amplifier may include the high frequency converter 225, the coupling transformer 230, and the resonator 245 and the second high frequency amplifier may include the high frequency converter 235, the coupling transformer 240, and the resonator 250. In addition, although not shown, the high frequency amplifying unit according to another embodiment of the present invention may be implemented by linear amplifiers for generating high frequency amplification signals from DC voltages without transformers.

The combiner 255 can be implemented with a 3 dB coupler. The combiner 255 combines the first high frequency amplification signal vR1 and the second high frequency amplification signal vR2 to output a high frequency power signal vR_pwr. When the phase of the first high frequency amplification signal vR1 leads 90 degrees ahead of the phase of the second high frequency amplification signal vR2, the high frequency power signal vR_pwr may be almost outputted to a load side terminal (not shown). When the phase of the first high frequency amplification signal vR1 lags 90 degrees behind the phase of the second high frequency amplification signal vR2, the high frequency power signal vR_pwr may be almost outputted to an end terminal (not shown). When the phase of the first high frequency amplification signal vR1 and the phase of the second high frequency amplification signal vR2 are the same, the high frequency power signal vR_pwr may be outputted in half to the load side terminal and the end terminal.

As such, the high frequency amplifying unit controls the phase of the first high frequency signal v1 and the phase of the second high frequency signal v2 to adjust the phase of the first high frequency amplification signal vR1 and the second high frequency amplification signal vR2. Accordingly, a magnitude of the high frequency power signal vR_pwr outputted to the plasma chamber 260 may be adjusted.

The high frequency sensor 265 is disposed between the combiner 255 and the plasma chamber 260 and detects an electrical signal flowing between the combiner 255 and the plasma chamber 260 to output an electrical detection signal. The electrical detection signal includes at least one or more of a detection current value Is, a detection voltage value Vs, a forward power PFWD supplied from the combiner 255 to the plasma chamber 260, and a backward power PREF reflected from the plasma chamber 260 to the combiner 255.

The controller 270 uses an externally applied control signal Scon and the electrical detection signal outputted from the high frequency sensor 265 to generate a voltage control signal Vcon, a first amplification control signal Pcon1, a second amplification control signal Pcon2 and a switching control signal Ssw.

The switching unit 275 is disposed between the combiner 255 and the plasma chamber 260, and is controlled by the switching control signal Ssw outputted from the controller 270 to convert the high frequency power signal outputted from the combiner 255 into a first high frequency power output signal SA or a second high frequency power output signal SB. According to the present invention, the plasma chamber 260 is grounded to a chamber wall.

According to one embodiment of the invention, the switching unit 275 may be implemented as a mechanical switch. For example, the switching unit 275 may be implemented by one relay using the switching control signal Ssw outputted from the controller 270 as a driving signal.

In addition, according to another embodiment of the present invention, the switching unit 275 may be implemented as two electronic switches. For example, the two electronic switches may be alternately switched by being controlled by the switching control signal Ssw outputted from the controller 270. On the other hand, according to the present invention, it can be implemented using two or more electronic switches. It will be apparent to those skilled in the art will not be described in detail.

Although not shown, a first impedance matching unit may be arranged between the switching unit 275 and an upper electrode of the plasma chamber, and a second impedance matching unit may be arranged between the switching unit 275 and a lower electrode of the plasma chamber.

Figure 3A:
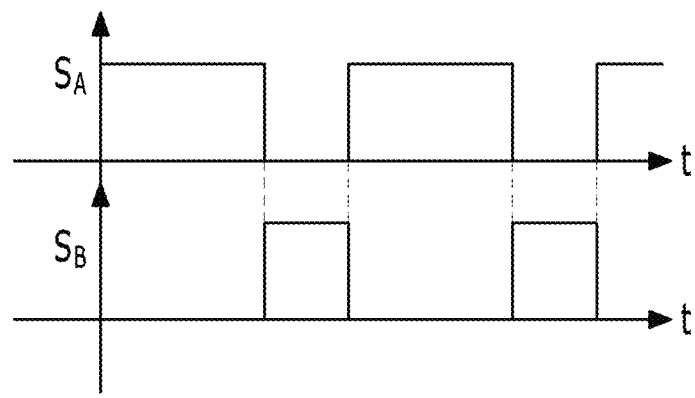
FIGS. 3A, 3B and 3C are, respectively, output waveform diagrams of a high frequency generator having dual outputs according to the present invention.
Figure 3B:
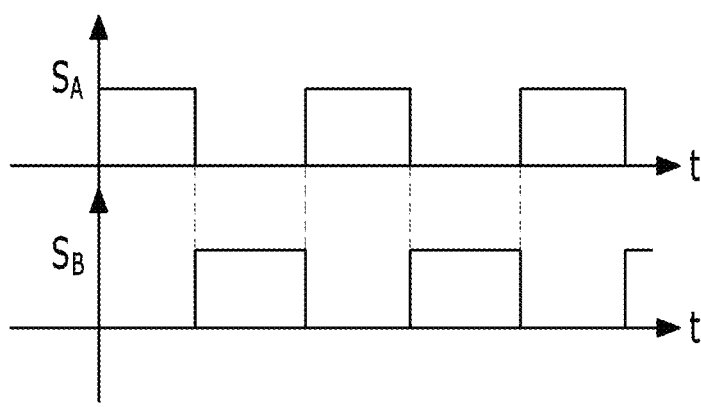
Figure 3C:
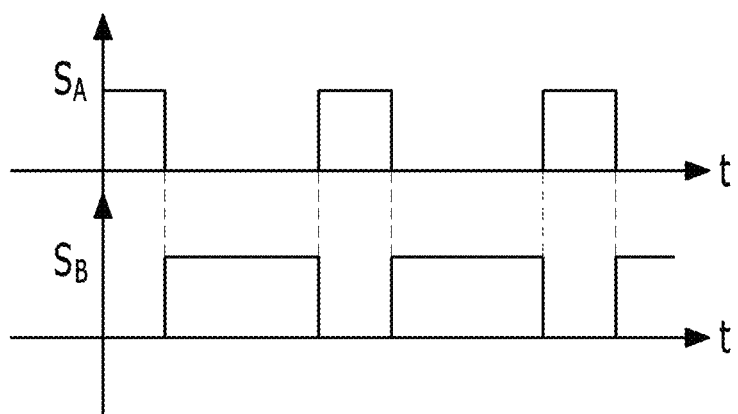

FIG. 3 is an output waveform diagram of a high frequency generator with a dual output according to the present invention. FIG. 3a is a waveform diagram of providing a first high frequency power output signal SA and a second high frequency power output signal SB at a ratio of 7:3. FIG. 3b is a waveform diagram of providing a first high frequency power output signal SA and a second high frequency power output signal SB at a ratio of 5:5. FIG. 3c is a waveform diagram of providing a first high frequency power output signal SA and a second high frequency power output signal SB at a ratio of 2:8.

Depending on a process conditions in the plasma chamber 260, the high frequency generator having dual outputs can provide only one of the first high frequency power output signal SA and the second high frequency power output signal SB. On the other hand, it is very difficult to accurately detect or predict a plasma generated in the plasma chamber 260 when the first high frequency power output signal SA or the second high frequency power output signal SB is provided in the plasma chamber. It is much more difficult to predict and control the plasma generated in the plasma chamber 260 when the first high frequency power output signal SA to the upper electrode of the plasma chamber 260, and the second high frequency power output signal SB to the lower electrode of the plasma chamber 260 are applied simultaneously.

Accordingly, in the present invention, one high frequency generator generates two high frequency power output signals, but provides only one of two high frequency power output signals to the plasma chamber 260 on a timeline. As a result, it enables easy control of the high frequency generator.

Figure 4:
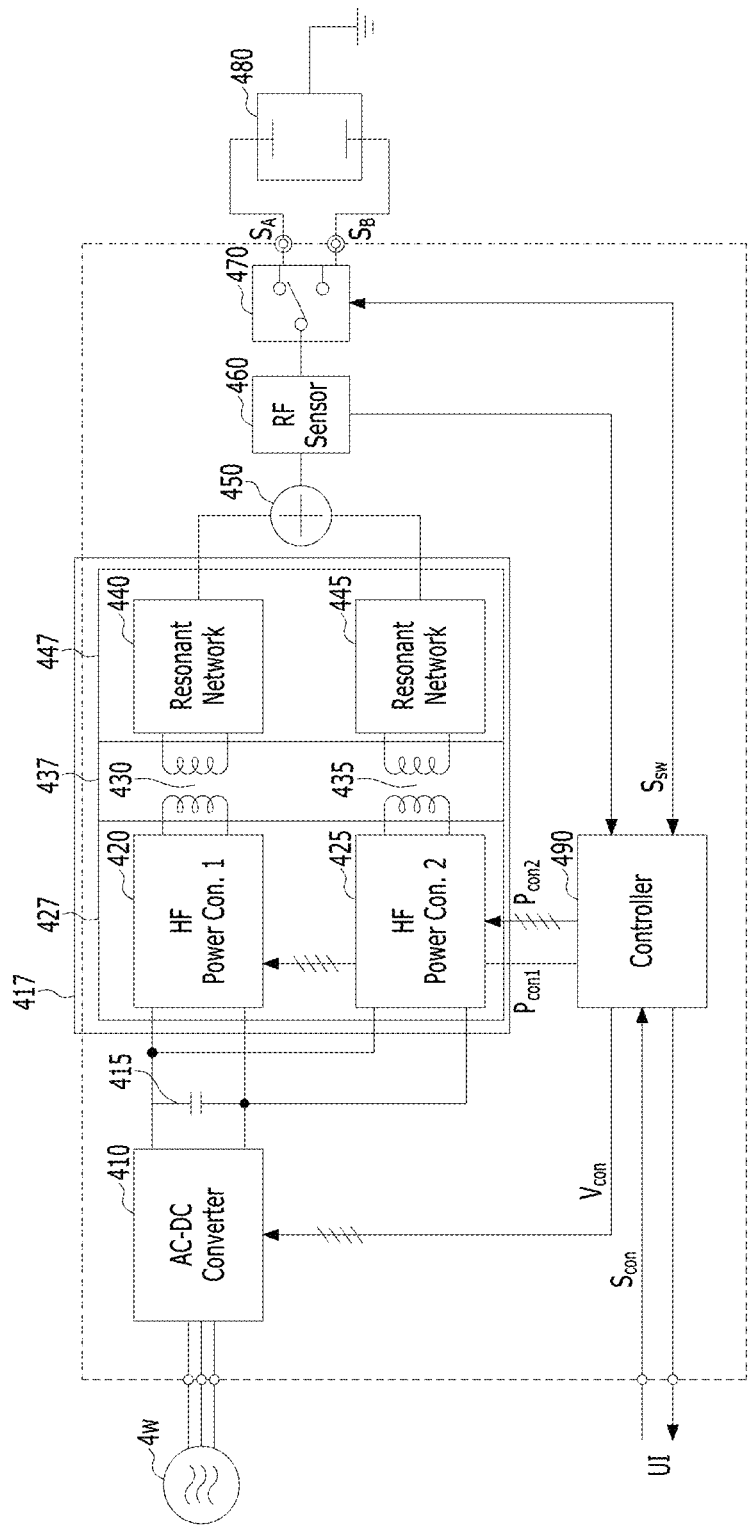
FIG. 4 is a block diagram illustrating a high frequency generator having dual outputs according to another embodiment of the present invention.

FIG. 4 is a block diagram illustrating a high frequency generator capable of monitoring dual outputs according to the present invention.

The high frequency generator capable of monitoring dual outputs according to the present invention includes an AC-DC converting unit 410, a smoother 415, a high frequency amplifying unit 417, a combiner 450, a high frequency sensor 460, a switching unit 470, a plasma chamber 480, and a controller 490.

The AC-DC converting unit 410 is controlled by the voltage control signal Vcon outputted from the controller 490 to convert a commercial 3 phase AC voltage into a DC voltage of a predetermined level.

The smoother 415 smooths the DC voltage outputted from the AC-DC converting unit 410.

In one embodiment of the present invention, the high frequency amplifying unit 417 includes a high frequency power converting unit 427, a coupling transforming unit 437, and a resonating network 447.

The high frequency converting unit 427 amplifies the DC voltage of a predetermined level outputted from the AC-DC converter 410 to generate high frequency signals having a pulse waveform. The high frequency converting unit 427 may operate two or more high frequency converters in parallel to generate a high frequency power signal having voltages and frequencies suitable for various load conditions.

In one embodiment of the present invention, the high frequency converting unit 427 includes two high frequency converters 420 and 425. A first high frequency converter 420 is controlled by the first conversion control signal Pcon1 outputted from the controller 490 and outputs the first high frequency conversion signal v1. A second high frequency converter 425 is controlled by the second conversion control signal Pcon2 outputted from the controller 490 and outputs the second high frequency conversion signal v2. The phase of the first high frequency conversion signal v1 may be the same as the one of the second high frequency conversion signal v2 or the phase of the first high frequency conversion signal v1 may be different from the one of the second high frequency conversion signal v2.

The coupling transforming unit 437 includes a first coupling transformer 430 and a second coupling transformer 435. The first coupling transformer 430 induces a high frequency conversion signal of a pulse waveform outputted from the first high frequency power converter 420 to the secondary side, and the second coupling transformer 435 induces a high frequency conversion signal of a pulse waveform outputted from the second high frequency power converter 425 to the secondary side. The coupling transforming unit 437 electrically insulates the primary side and the secondary side, so that it is to prevent an electric shock accident that may occur when a user contacts the plasma chamber included in an RF load.

The resonating network 447 includes a first resonator 140 and a second resonator 445. The first resonator 440 and the second resonator 445 have an inductor and a capacitor coupled in parallel respectively. The resonating network 447 outputs high frequency amplification signals having a sine wave having a predetermined resonant frequency by using a high frequency conversion signal induced on the secondary side of the coupling transforming unit 437. The first resonator 440 outputs a first high frequency amplification signal vR1 and the second resonator 445 outputs a second high frequency amplification signal vR2.

Meanwhile, a phase of the first high frequency amplification signal vR1 may be the same as the one of the second high frequency amplification signal vR2 or a phase of the first high frequency amplification signal vR1 may be different from the one of the second high frequency amplification signal vR2. When the phase of the first high frequency amplification signal vR1 is different from the one of the second high frequency amplification signal vR2, the phase of the second high frequency amplification signal vR2 leads or lags the phase of the first high frequency amplification signal vR1. A resonant frequency of the high frequency amplification signals of the present invention may be 13.56 MHz.

In addition, although not shown, the high frequency amplification unit according to another embodiment of the present invention may be implemented by linear amplifiers for generating high frequency amplification signals from DC voltages without transformers.

The combiner 450 can be implemented with a 3 dB coupler. The combiner 450 combines the first high frequency amplification signal vR1 and the second high frequency amplification signal vR2 to output a high frequency power signal vR_pwr. When the phase of the first high frequency amplification signal vR1 leads 90 degrees ahead of the phase of the second high frequency amplification signal vR2, the high frequency power signal vR_pwr may be almost outputted to the load side terminal (not shown). When the phase of the first high frequency amplification signal vR1 lags 90 degrees behind the phase of the second high frequency amplification signal vR2, the high frequency power signal vR_pwr may be almost outputted to an end terminal (not shown). When the phase of the first high frequency amplification signal vR1 and the phase of the second high frequency amplification signal vR2 are the same, the high frequency power signal vR_pwr may be outputted in half to the load side terminal and the end terminal.

As such, the high frequency amplifying unit controls the phase of the first high frequency signal v1 and the phase of the second high frequency signal v2 to adjust the phase of the first high frequency amplification signal vR1 and the second high frequency amplification signal vR2. Accordingly, a magnitude of the high frequency power signal vR_pwr outputted to the plasma chamber 480 may be adjusted.

The high frequency sensor 460 is disposed between the combiner 450 and the plasma chamber 480 and detects an electrical signal flowing between the combiner 450 and the plasma chamber 480 to output an electrical detection signal. The electrical detection signal includes at least one or more of a detection current value Is, a detection voltage value Vs, a forward power PFWD supplied from the combiner 450 to the plasma chamber 480, and a backward power PREF reflected from the plasma chamber 480 to the combiner 450.

The controller 490 uses an externally applied control signal Scon and an electrical detection signal outputted from the high frequency sensor 460 to generate the voltage control signal Vcon, the first amplification control signal Pcon1, the second amplification control signal Pcon2, and the switching control signal Ssw.

The switching unit 470 is disposed between the combiner 450 and the plasma chamber 480, and is controlled by the switching control signal Ssw outputted from the controller 490 to convert the high frequency power signal outputted from the combiner 450 into a first high frequency power output signal SA or a second high frequency power output signal SB. According to the present invention, the plasma chamber 480 is grounded to the chamber wall.

According to one embodiment of the invention, the switching unit 470 may be implemented as a mechanical switch. For example, the switching unit 470 may be implemented by one relay using the switching control signal Ssw outputted from the controller 490 as a driving signal.

In addition, according to another embodiment of the present invention, the switching unit 470 may be implemented as two electronic switches. For example, the two electronic switches may be alternately switched by being controlled by the switching control signal Ssw outputted from the controller 490. On the other hand, according to the present invention, it can be implemented using two or more electronic switches. It will be apparent to those skilled in the art will not be described in detail.

Although not shown, a first impedance matching unit may be arranged between the switching unit 470 and the upper electrode of the plasma chamber 480, and a second impedance matching unit may be arranged between the switching unit 470 and the lower electrode of the plasma chamber 480.

Figure 5:
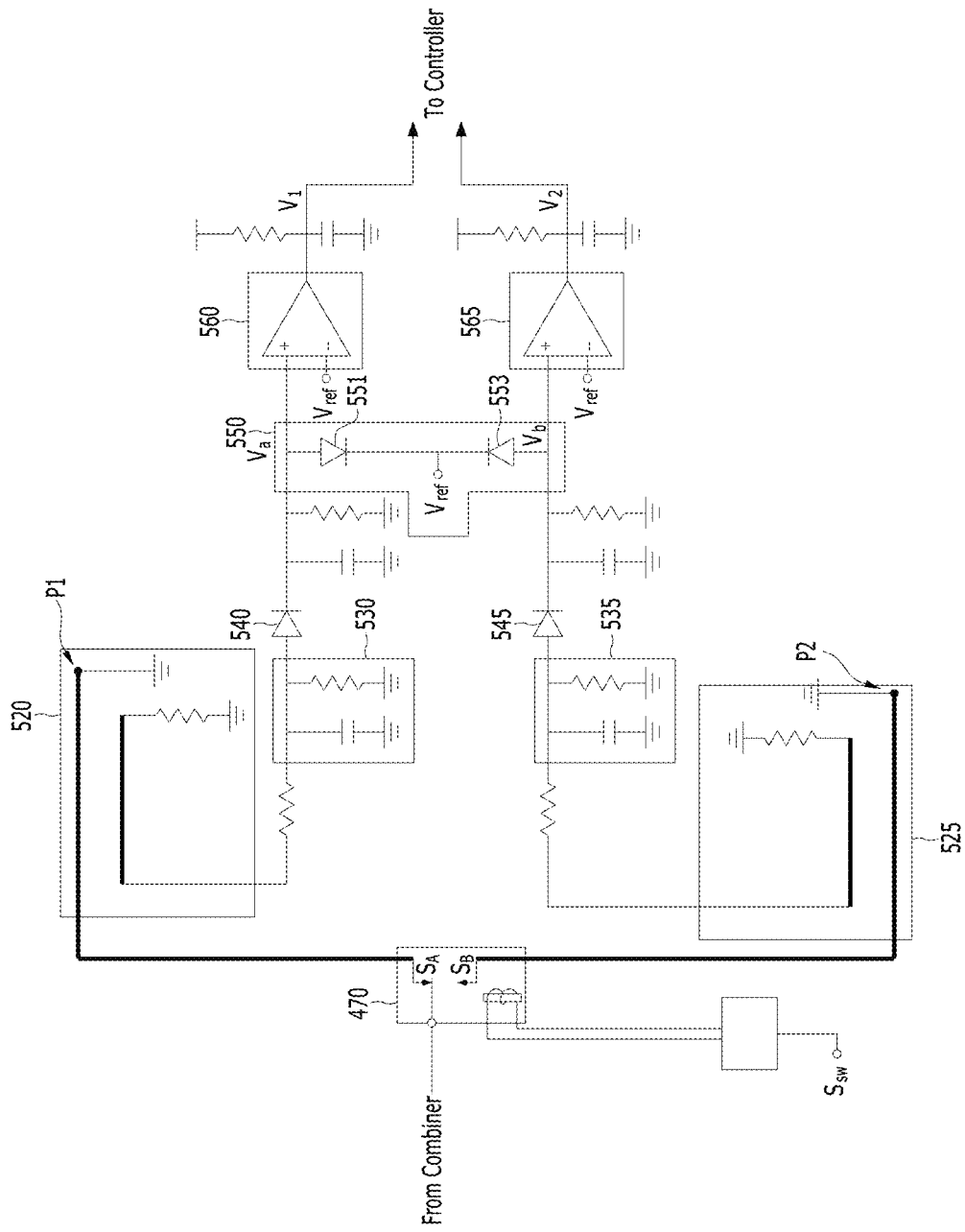
FIG. 5 is a circuit illustrating dual outputs monitoring unit according to an embodiment of the present invention.

FIG. 5 is a circuit illustrating dual outputs monitoring unit according to the present invention.

The circuit illustrating dual outputs monitoring unit according to the present invention includes a relay 510, a high frequency power detecting unit 520 and 525, an impedance matching unit 530 and 535, a backward signal blocking unit 540 and 545, a noise interference cancelling unit 550, and a comparing unit 560 and 565.

The relay 510 is controlled by the switching control signal Ssw outputted from the controller 490, and outputs the first high frequency power output signal SA via an A contact point of the relay 510, and the second high frequency power output signal SB via an B contact point of the relay 510.

The high frequency power detecting unit 520 and 525 includes a first high frequency power detector 520 connected to the A contact point of the relay 510 and a second high frequency power detector 525 connected the B contact point of the relay 510. The first high frequency power detector 520 uses a first micro strip transformer connected to the A contact point of the relay 510, detects a high frequency power of the first high frequency power output signal SA at a secondary side of the first micro strip transformer, and outputs a first high frequency power signal. The second high frequency power detector 525 uses a second micro strip transformer connected to the B contact point of the relay 510, detects a high frequency power of the second high frequency power output signal SA at a secondary side of the second micro strip transformer, and outputs a second high frequency power signal.

The impedance matching unit 530 and 535 is disposed between the high frequency power detecting unit 520 and 525 and the comparing unit 560 and 565, matches an impedance of the high frequency power detecting unit 520 and 525 and an impedance of the comparing unit 560 and 565. The impedance matching unit 530 and 535 includes a first impedance matcher 530 and a second impedance matcher 535. The first impedance matcher 530 includes a resistor and a capacitor disposed between an output side of the first high frequency power detector 520 and a ground. The second impedance matcher 535 includes a resistor and a capacitor disposed between an output side of the second high frequency power detector 525 and the ground.

The backward signal blocking unit 540 and 545 includes a first one-way element 540 forwardly connected to the first impedance matcher 530 and a second one-way element 545 forwardly connected to the first impedance matcher 535. The first one-way element 540 passes the high frequency power outputted from the first high frequency power detector 520 to a first comparator 560 and blocks signals flowing from the first comparator 560 to the first high frequency power detector 520. The second one-way element 545 passes the high frequency power outputted from the second high frequency power detector 525 to a second comparator 565 and blocks signals flowing from the second comparator 565 to the second high frequency power detector 525. According to the present invention, the first and second one-way element 540 and 545 are implemented by a diode or diodes respectively.

The noise interference cancelling unit 550 includes a third one-way element 551 forwardly connected from an output terminal of the first one-way element 540 to a reference voltage terminal and a fourth one-way element 553 forwardly connected from an output terminal of the second one-way element 545 to the reference voltage terminal. According to the present invention, the third and fourth one-way element 551 and 553 are implemented by a diode or diodes having a forward voltage drop respectively. When an output voltage Va of the first one-way element 540 is applied to an anode terminal of the third one-way element 551, a reference voltage Vref applied to a cathode terminal of the third one-way element 551 has a potential lower than the output voltage Va of the first one-way element 540 by a forward voltage drop.

The comparing unit 560 and 565 includes the first comparator 560 and the second comparator 565. The first comparator 560 compares the output voltage of the first one-way element with the reference voltage Vref and outputs a first comparison signal V1. When the output voltage of the first one-way element is higher than the reference voltage Vref, the first comparator 560 outputs the first comparison signal V1 having the "H" level. The second comparator 565 compares the output voltage of the second one-way element with the reference voltage Vref and outputs a second comparison signal V2. When the output voltage of the second one-way element is higher than the reference voltage Vref, the second comparator 565 outputs the second comparison signal V2 having the "H" level.

However, due to various factors such as a change in an impedance of a load or interference of a signal, an unwanted noise voltage may be included in an output Va of the first one-way element 540 or an output Vb of the second one-way element 545.

Figure 6:
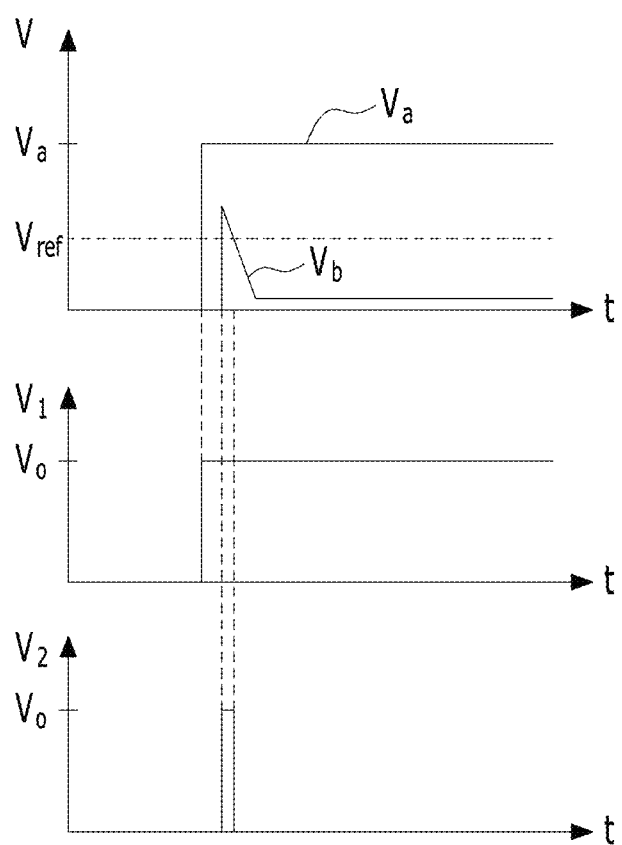
FIG. 6 is a waveform diagram for each part when a fixed reference voltage is applied.

FIG. 6 is a waveform diagram for each part when a fixed reference voltage is applied. In this case, when a level of the reference voltage Vref is fixed, the first comparison signal V1 having the "H" level is outputted because the output voltage Va of the first one-way element 540 is higher than the reference voltage Vref. The second comparison signal V2 having the "H" level is outputted at the instant when the output voltage Vb of the second one-way element 545 is also higher than the reference voltage Vref. As a result, an error occurs in detecting a relay operation.

Accordingly, the dual outputs monitoring circuit according to an embodiment of the present invention may include the noise interference cancelling unit 550 having the configuration as shown in FIG. 5 to prevent an error in detecting a relay operation.

Figure 7:
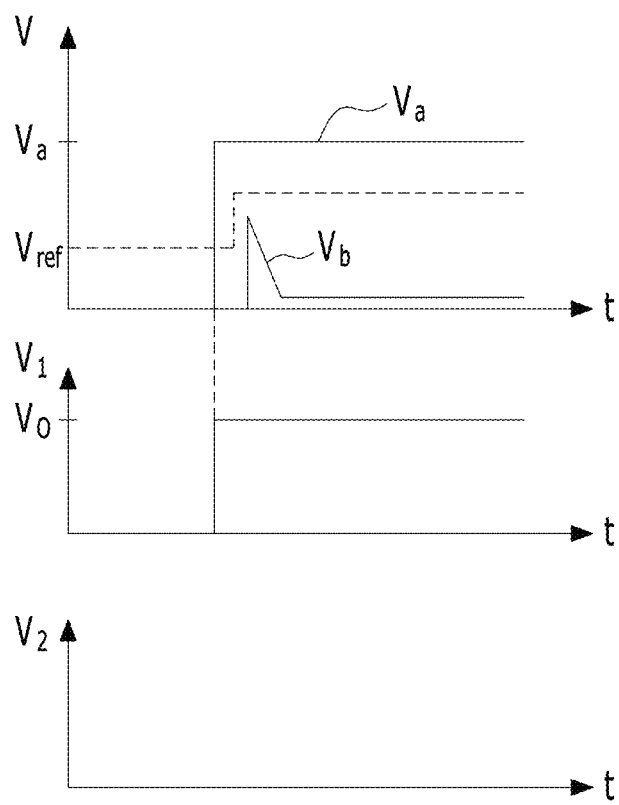
FIG. 7 is a waveform diagram for each part when a variable reference voltage is applied.

FIG. 7 is a waveform diagram for each part when a variable reference voltage is applied. When the output voltage Va of the first one-way element 540 and the output voltage Vb of the second one-way element 545 are 0V, the reference voltage Vref maintains a predetermined level. And then, when the output voltage Va of the first one-way device 540 rises to a predetermined potential, the reference voltage Vref is affected by the third one-way element 551. The reference voltage Vref rises to a potential lower by the forward voltage drop. At that time, even when a noise voltage is inserted into the output voltage Vb of the second one-way element 545, the level of the reference voltage Vref is increased, so that the output voltage V2 of the second comparator 565 may maintain the "L" level state.

Figure 8:
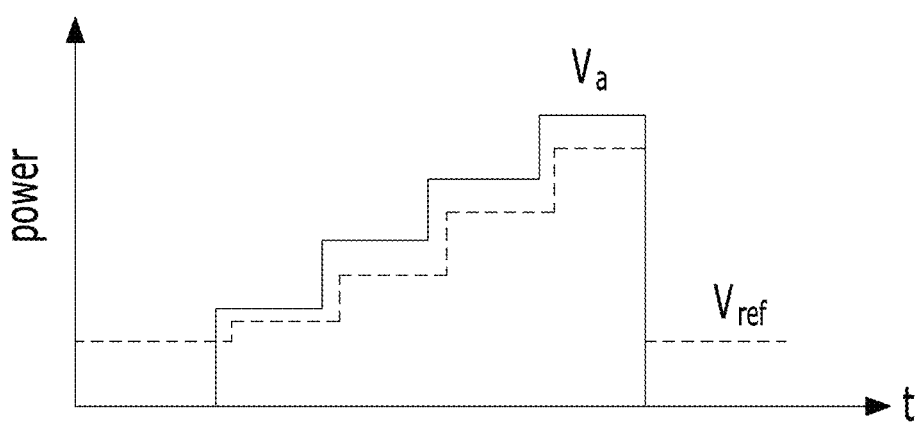
FIG. 8 is a waveform diagram of the reference voltage increase with increasing output voltage.

FIG. 8 is a waveform diagram of the reference voltage increase with increasing output voltage. When the output voltage Va of the first one-way element 540 rises, the reference voltage Vref also rises while maintaining the potential difference by the forward voltage drop.

Figure 9:
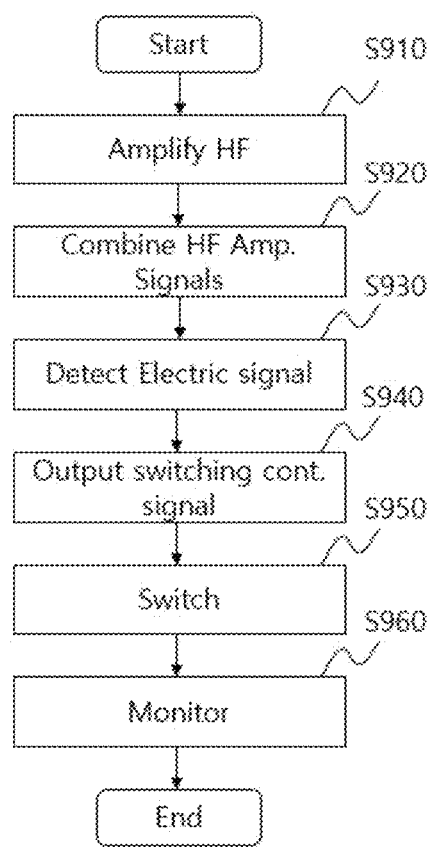
FIG. 9 is a flow chart for driving a high frequency generator having dual outputs according to an embodiment of the present invention.

FIG. 9 is a flow chart for driving a high frequency generator having dual outputs according to an embodiment of the present invention.

A driving method for a high frequency generator having dual outputs comprises: a high frequency amplifying step to amplify a DC voltage of a predetermined level, and output a first and a second high frequency amplification signal by a high frequency amplifying unit (S910); a high frequency amplification signal combining step to combine the first high frequency amplification signal and the second high frequency amplification signal, and output a high frequency power signal by a combiner (S920); an electric signal detecting step to detect the electric signal flowing the output side of the combiner, and output the electric detection signal by an electric signal detecting unit (S930); a switching control signal outputting step to output multiple control signals by using an externally applied control signal and the electric detection signal by a controller (S940); a switching step to output the high frequency power signal to a first high frequency power output signal through a first output terminal and to output the high frequency power signal to a second high frequency power signal through a second output terminal controlled by a switching control signal outputted from the controller (S950); and a monitoring step to monitor the operation state of the switching unit by detecting the first and the second high frequency power output signals (S960).

Figure 10:
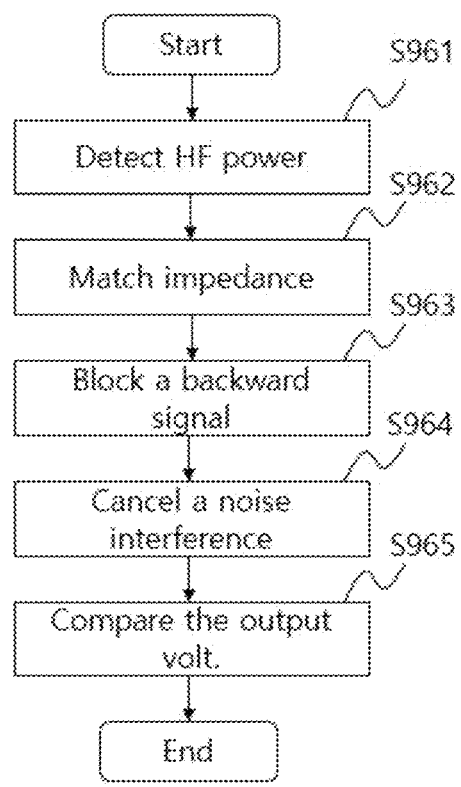
FIG. 10 is a flow chart for monitoring a high frequency generator having dual outputs according to an embodiment of the present invention.

FIG. 10 is a flow chart for monitoring a high frequency generator having dual outputs according to an embodiment of the present invention.

In the driving method for a high frequency generator having dual outputs, the monitoring step (S960) comprises: a high frequency power detecting step to detect a first high frequency power from the first high frequency power output signal and to detect a second high frequency power of the second high frequency power output signal (S961); an impedance matching step to match the impedance of the first high frequency power and the impedance of a first comparator, and match the impedance of the second high frequency power and the impedance of a second comparator (S962); a backward signal blocking step to block signals flowing from the first comparator to the first high frequency power detector by a first one-way element, and to block signals flowing from the second comparator to the second high frequency power detector by a second one-way element (S963); a noise interference cancelling step to cancel a noise flowing from a reference voltage terminal to the output terminal of the first one-way element, and to cancel a noise flowing from the reference voltage terminal to the output terminal of the second one-way element (S964); and a comparing step to compare the output voltage of the first one-way element with the reference voltage by the first comparator and to compare the output voltage of the second one-way element with the reference voltage by the second comparator (S965).

Various modifications can be made in the invention disclosed above within the scope not impairing the basic scope. That is, all the above embodiments should be construed to be illustrative and is not construed to be limitative. Accordingly, the protection scope of the present invention should be defined according to the accompanying claims rather than the above embodiment, and when elements defined in the accompanying claims are replaced with equivalents thereof, this is intended to fall within the scope of the present invention.

DESCRIPTION OF REFERENCE NUMERALS
OF IMPORTANT PARTS

200: commercial AC source
203: EMI filter
205: rectifier
210: DC/DC converter
215: auxiliary DC/DC converter
220: fan
223: smoothing unit
227: high frequency converting unit
237: first and second coupling transforming unit
247: resonating unit
255: combiner
260: plasma chamber
265: high frequency sensor
270: controller
275: switch
410: AC-DC converting unit
415: smoother
417: high frequency amplifying unit
427: high frequency power converting unit
437: coupling transforming unit
447: resonating network
450: combiner 460: high frequency sensor
470: switch
480: plasma chamber
490: controller
520, 525: high frequency power detecting unit
530, 535: impedance matching unit
540: first one-way element
545: second one-way element
550: noise interference cancelling unit
560: first comparator 560
565: second comparator 565

The invention claimed is:

1. A high frequency generator having dual outputs comprising:
a high frequency amplifying unit configured to amplify a DC voltage of a predetermined level, and output a first and a second high frequency amplification signal;
a combiner configured to combine the first high frequency amplification signal and the second high frequency amplification signal, and output a high frequency power signal;
a high frequency sensor disposed on output side of the combiner, configured to detect an electrical signal flowing the output side of the combiner, and output an electrical detection signal;
a controller configured to output multiple control signals by using an externally applied control signal and the electrical detection signal; and
a switching unit disposed between the combiner and a plasma chamber, and controlled by a switching control signal outputted from the controller to output the high frequency power signal to a first high frequency power output signal through a first output terminal and to output the high frequency power signal to a second high frequency power signal through a second output terminal.

2. The high frequency generator having dual outputs of claim 1, wherein the switching unit is implemented by a mechanical switch or an electronic switch, the first high frequency power output signal outputted through the first output terminal of the switching unit is outputted to an upper electrode of the plasma chamber and the second high frequency power output signal outputted through the second output terminal of the switching unit is outputted to a lower electrode of the plasma chamber.

3. The high frequency generator having dual outputs of claim 2, wherein the first and the second high frequency power signals are outputted periodically or aperiodically.

4. The high frequency generator having dual outputs of claim 1, the high frequency generator further includes a dual outputs monitoring unit configured to monitor an operation state of the switching unit by detecting the first and the second high frequency power output signals.

5. The high frequency generator having dual outputs of claim 4,
wherein the dual outputs monitoring unit comprising:
a first and a second high frequency power detectors configured to detect a first high frequency power from the first high frequency power output signal and detect a second high frequency power of the second high frequency power output signal respectively;
a first and a second impedance matchers configured to match an impedance of the first high frequency power and an impedance of a first comparator and match an impedance of the second high frequency power and an impedance of a second comparator respectively;
a backward signal blocking unit including a first one-way element and a second one-way element, wherein the first one-way element blocks signals flowing from the first comparator to the first high frequency power detector, and the second one-way element blocks signals flowing from the second comparator to the second high frequency power detector; and
a noise interference cancelling unit including a third one-way element and a fourth one-way element, wherein the third one-way element is connected forwardly from an output terminal of the first one-way element to a reference voltage terminal and the fourth one-way element is connected forwardly from an output terminal of the second one-way element to the reference voltage terminal,
wherein the first comparator compares the output voltage of the first one-way element with the reference voltage and the second comparator compares the output voltage of the second one-way element with the reference voltage.

6. The high frequency generator having dual outputs of claim 5, wherein the first high frequency power detector includes a first micro strip transformer connected to the first output terminal of the switch, and the second high frequency power detector includes a second micro strip transformer connected to the second output terminal of the switch.

7. The high frequency generator having dual outputs of claim 6, wherein each of the first to the fourth one-way elements is diode.

8. A driving method for a high frequency generator having dual outputs comprising:
a high frequency amplifying step to amplify a DC voltage of a predetermined level, and output a first and a second high frequency amplification signal by a high frequency amplifying unit;
a high frequency amplification signal combining step to combine the first high frequency amplification signal and the second high frequency amplification signal, and output a high frequency power signal by a combiner;
an electric signal detecting step to detect the electric signal flowing the output side of the combiner, and output the electric detection signal by an electric signal detecting unit;
a switching control signal outputting step to output multiple control signals by using an externally applied control signal and the electric detection signal by a controller; and
a switching step to output the high frequency power signal to a first high frequency power output signal through a first output terminal and to output the high frequency power signal to a second high frequency power signal through a second output terminal controlled by a switching control signal outputted from the controller.

9. The driving method for a high frequency generator having dual outputs of claim 8, wherein the switching unit is implemented by a mechanical switch or an electronic switch, the first high frequency power output signal outputted through the first output terminal of the switch is outputted to an upper electrode of a plasma chamber and the second high frequency power output signal outputted through the second output terminal of the switch is outputted to a lower electrode of the plasma chamber.

10. The driving method for a high frequency generator having dual outputs of claim 9, wherein the first and the second high frequency power signals are outputted periodically or aperiodically.

11. The driving method for a high frequency generator having dual outputs of claim 8, the driving method for a high frequency generator further includes a dual outputs monitoring step to monitor the operation state of the switching unit by detecting the first and the second high frequency power output signals.

12. The driving method for a high frequency generator having dual outputs of claim 11,
wherein the dual outputs monitoring step comprising:
a high frequency power detecting step to detect a first high frequency power from the first high frequency power output signal and to detect a second high frequency power of the second high frequency power output signal;
an impedance matching step to match an impedance of the first high frequency power and an impedance of a first comparator, and match an impedance of the second high frequency power and an impedance of a second comparator;
a backward signal blocking step to block signals flowing from the first comparator to the first high frequency power detector by a first one-way element, and to block signals flowing from the second comparator to the second high frequency power detector by a second one-way element;
a noise interference cancelling step to cancel a noise flowing from a reference voltage terminal to an output terminal of the first one-way element, and to cancel a noise flowing from the reference voltage terminal to an output terminal of the second one-way element; and
a comparing step to compare the output voltage of the first one-way element with the reference voltage by the first comparator and to compare the output voltage of the second one-way element with the reference voltage by the second comparator.

13. The driving method for a high frequency generator having dual outputs of claim 12, wherein the first high frequency power detector includes a first micro strip transformer connected to the first output terminal of the switch, and the second high frequency power detector includes a second micro strip transformer connected to the second output terminal of the switch.

* * * * *